US011515262B2

(12) United States Patent
Lee et al.

(10) Patent No.: US 11,515,262 B2
(45) Date of Patent: Nov. 29, 2022

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Juhyung Lee, Siheung-si (KR); Seok Geun Ahn, Cheonan-si (KR); Sunchul Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 17/130,170

(22) Filed: Dec. 22, 2020

(65) Prior Publication Data

US 2021/0375773 A1 Dec. 2, 2021

(30) Foreign Application Priority Data

May 29, 2020 (KR) .......................... 10-2020-0064701

(51) Int. Cl.
| | |
|---|---|
| H01L 23/538 | (2006.01) |
| H01L 25/10 | (2006.01) |
| H01L 23/373 | (2006.01) |
| H01L 23/31 | (2006.01) |
| H01L 23/13 | (2006.01) |

(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 23/13* (2013.01); *H01L 23/3128* (2013.01); *H01L 23/3733* (2013.01); *H01L 23/5383* (2013.01); *H01L 23/5385* (2013.01); *H01L 23/5386* (2013.01); *H01L 25/0655* (2013.01); *H01L 25/105* (2013.01); *H01L 25/50* (2013.01); *H01L 2225/1035* (2013.01); *H01L 2225/1041* (2013.01);

(Continued)

(58) Field of Classification Search
CPC ............. H01L 23/5389; H01L 21/4853; H01L 21/4857; H01L 21/565; H01L 23/13; H01L 23/3128; H01L 23/3733; H01L 23/5383; H01L 23/5385; H01L 23/5386; H01L 25/0655; H01L 25/105; H01L 25/50; H01L 2225/1035; H01L 2225/1041; H01L 2225/1058; H01L 2225/1094

See application file for complete search history.

(56) References Cited

U.S. PATENT DOCUMENTS

| | | |
|---|---|---|
| 9,252,127 B1 | 2/2016 | Shen et al. |
| 9,331,058 B2 | 5/2016 | Bruno et al. |

(Continued)

*Primary Examiner* — Fernando L Toledo
*Assistant Examiner* — Neil R Prasad
(74) *Attorney, Agent, or Firm* — F. Chau & Associates, LLC

(57) ABSTRACT

A semiconductor package includes a first substrate including a first recess formed in a top surface of the first substrate, a first semiconductor chip disposed in the first recess and mounted on the first substrate, an interposer substrate disposed on the first semiconductor chip and including a second recess formed in a bottom surface of the interposer substrate, an adhesive layer disposed in the second recess and in contact with a top surface of the first semiconductor chip, a plurality of connection terminals spaced apart from the first recess and connecting the first substrate to the interposer substrate, and a molding layer disposed between the first substrate and the interposer substrate.

20 Claims, 15 Drawing Sheets

(51) Int. Cl.
*H01L 21/48* (2006.01)
*H01L 21/56* (2006.01)
*H01L 25/00* (2006.01)
*H01L 25/065* (2006.01)

(52) U.S. Cl.
CPC ............... *H01L 2225/1058* (2013.01); *H01L 2225/1094* (2013.01)

(56) References Cited

U.S. PATENT DOCUMENTS

| | | |
|---|---|---|
| 9,379,090 B1 | 6/2016 | Syed et al. |
| 9,490,196 B2 | 11/2016 | Teh et al. |
| 9,548,251 B2 | 1/2017 | Khan et al. |
| 10,002,857 B2 * | 6/2018 | Solimando .......... H01L 21/4882 |
| 10,256,177 B2 | 4/2019 | Shen et al. |
| 2012/0043668 A1 * | 2/2012 | Refai-Ahmed ......... H01L 23/42 438/109 |
| 2017/0317019 A1 * | 11/2017 | Shen ................. H01L 23/49838 |
| 2018/0350755 A1 * | 12/2018 | Huang ................ H01L 23/3737 |
| 2019/0139915 A1 * | 5/2019 | Dalmia ............... H01L 23/5383 |

* cited by examiner

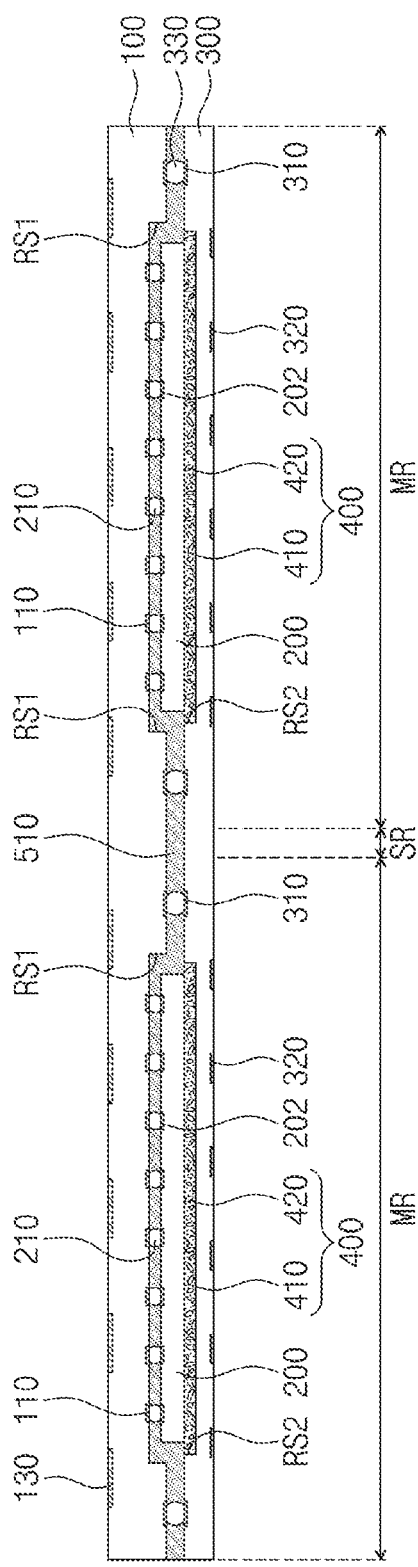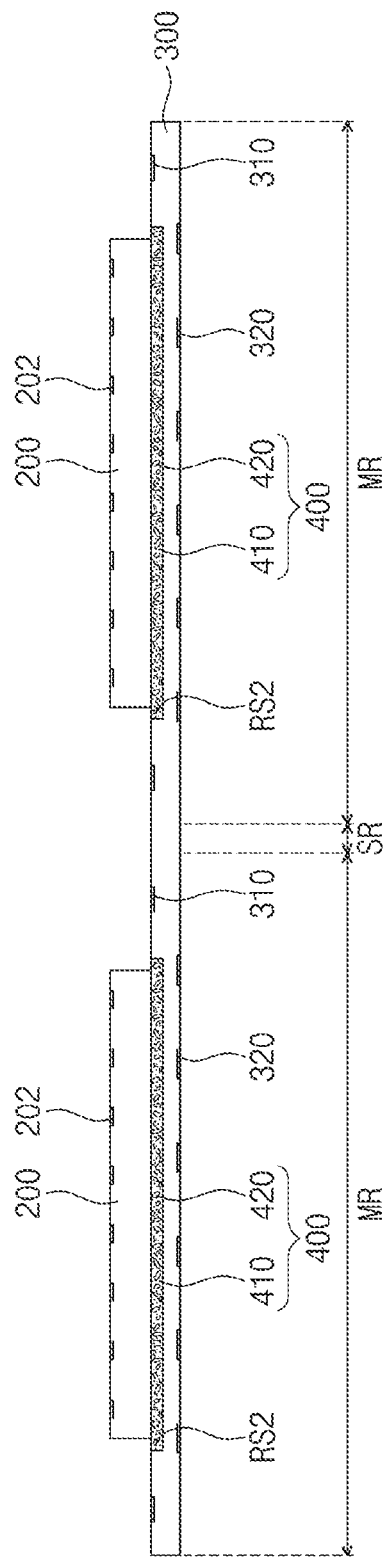

SEMICONDUCTOR PACKAGE AND METHOD OF FABRICATING THE SAME

CROSS-REFERENCE TO RELATED APPLICATION

This U.S. nonprovisional application claims priority under 35 U.S.0 § 119 to Korean Patent Application No. 10-2020-0064701, filed on May 29, 2020 in the Korean Intellectual Property Office, the disclosure of which is hereby incorporated by reference in its entirety.

TECHNICAL FIELD

Exemplary embodiments of the present inventive concept relate to a semiconductor package and a method of fabricating the same.

DISCUSSION OF RELATED ART

A semiconductor package may be used to implement an integrated circuit chip for use in electronic products. Typically, in a semiconductor package, a semiconductor chip is mounted on a printed circuit board (PCB), and bonding wires or bumps are used to electrically connect the semiconductor chip to the PCB.

As advancements are made in the electronic industry, there is a growing demand for electronic products having high performance, high speed, and compact size. To meet this demand, a packaging technology in which a plurality of semiconductor chips is mounted in a single package may be utilized. When a number of semiconductor packages are formed into a single package, an interposer may be provided to electrically connect the semiconductor packages to each other. The interposer may efficiently connect the semiconductor packages to each other and may increase the freedom of wiring of the semiconductor packages.

SUMMARY

Exemplary embodiments of the present inventive concept provide a compact-sized semiconductor package and a method of fabricating the same.

Exemplary embodiments of the present inventive concept provide a semiconductor package with increased efficiency of heat radiation and a method of fabricating the same.

Exemplary embodiments of the present inventive concept provide a semiconductor package with improved structural stability and a method of fabricating the same.

According to an exemplary embodiment of the present inventive concept, a semiconductor package includes a first substrate including a first recess formed in a top surface of the first substrate, a first semiconductor chip disposed in the first recess and mounted on the first substrate, an interposer substrate disposed on the first semiconductor chip and including a second recess formed in a bottom surface of the interposer substrate, an adhesive layer disposed in the second recess and in contact with a top surface of the first semiconductor chip, a plurality of connection terminals spaced apart from the first recess and connecting the first substrate to the interposer substrate, and a molding layer disposed between the first substrate and the interposer substrate.

According to an exemplary embodiment of the present inventive concept, a semiconductor package includes a first substrate, a first semiconductor chip mounted on the first substrate, and a molding layer disposed on the first substrate. The molding layer surrounds the first semiconductor chip and exposes a top surface of the first semiconductor chip. The semiconductor package further includes an interposer substrate disposed on the first semiconductor chip, and an adhesive layer disposed between the first semiconductor chip and the interposer substrate. The first substrate includes a protruding portion disposed on a side of the first semiconductor chip and extending toward the interposer substrate, the interposer substrate is connected to the first substrate through a connection terminal disposed between the protruding portion and the interposer substrate, and the adhesive layer is embedded in the interposer substrate.

According to an exemplary embodiment of the present inventive concept, a method of fabricating a semiconductor package includes filling a first recess of an interposer substrate with an adhesive layer, and forming an upper structure by attaching a first semiconductor chip and the interposer substrate to each other. An inactive surface of the first semiconductor chip is attached to the adhesive layer. The method further includes mounting the upper structure on a first substrate. When the upper structure is mounted on the first substrate, the first semiconductor chip is inserted into a second recess of the first substrate.

BRIEF DESCRIPTION OF THE DRAWINGS

The above and other features of the present inventive concept will become more apparent by describing in detail exemplary embodiments thereof with reference to the accompanying drawings, in which:

FIGS. 17 and 18 illustrate cross-sectional views showing a method of fabricating a semiconductor package according to exemplary embodiments of the present inventive concept.

FIGS. 19 to 22 illustrate cross-sectional views showing a method of fabricating a semiconductor package according to exemplary embodiments of the present inventive concept.

DETAILED DESCRIPTION OF EMBODIMENTS

Figure 1:
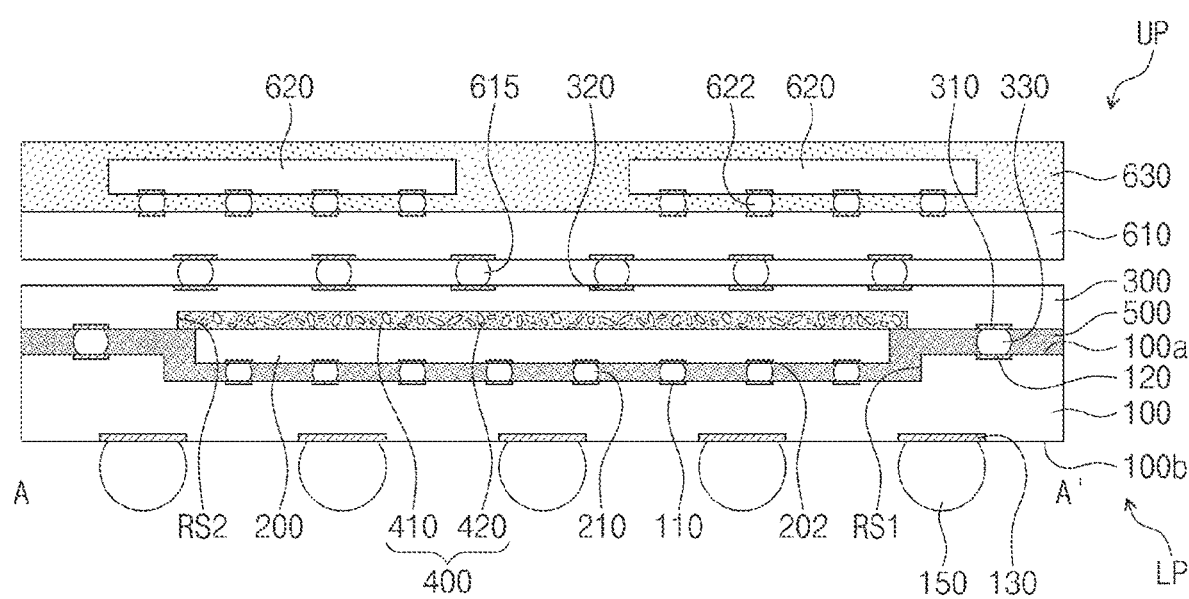
FIG. 1 illustrates a cross-sectional view showing a semiconductor package according to exemplary embodiments of the present inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms.

Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between components should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of the term "about" should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, when elements are described as being substantially coplanar with one another, it is to be understood that elements are exactly coplanar with one another, or almost coplanar with one another (e.g., within a measurement error), as would be understood by a person having ordinary skill in the art. Other uses of the term "substantially" should be interpreted in a like fashion.

Figure 2:
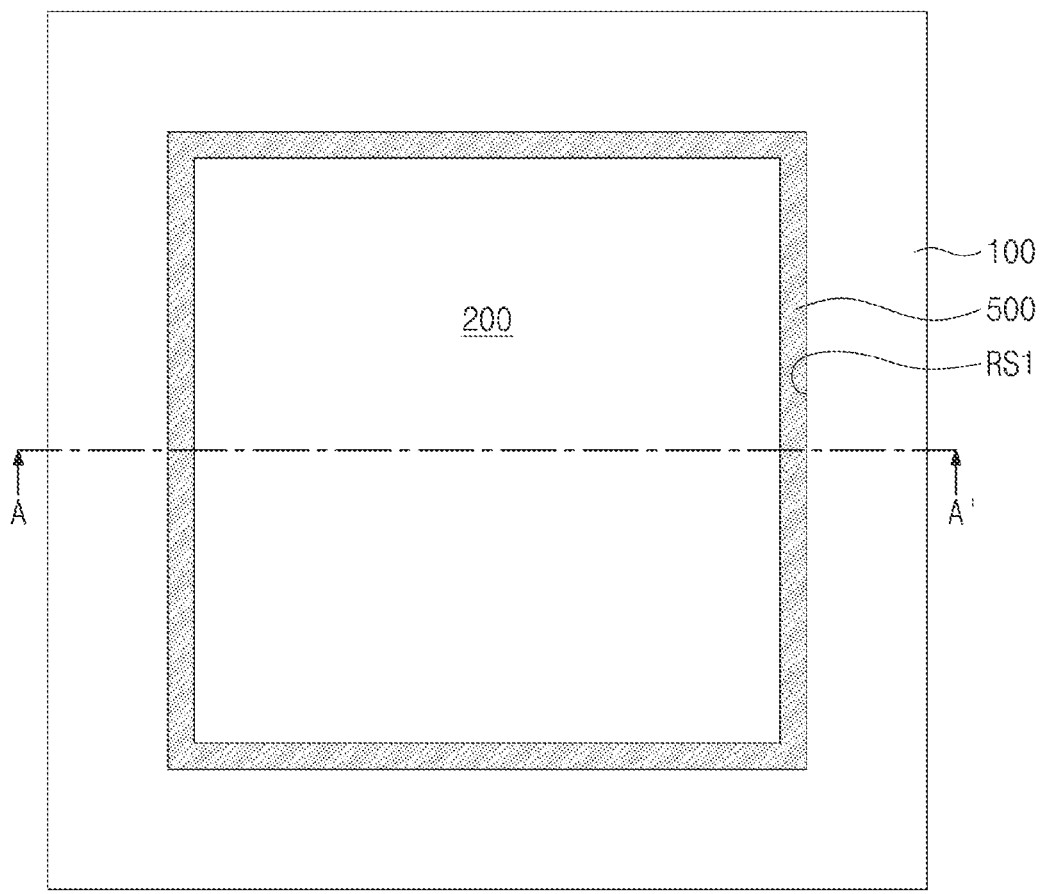
FIG. 2 illustrates a plan view showing a first recess of FIG. 1.
Figure 3:
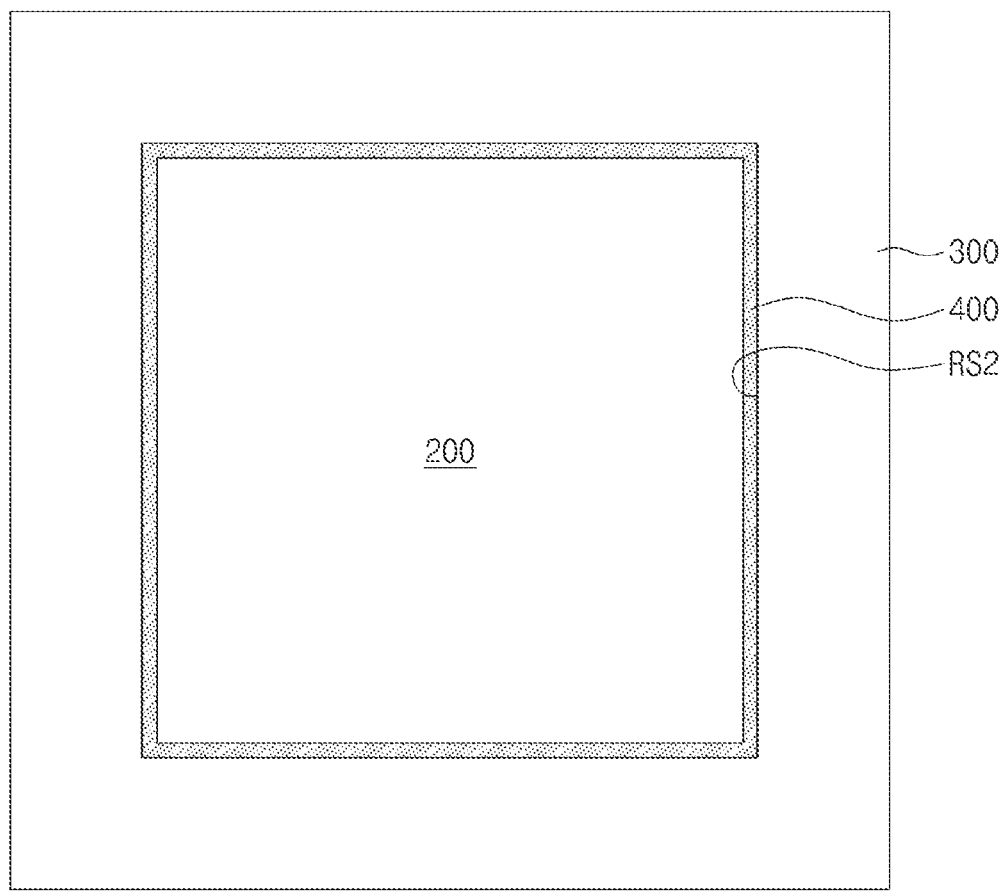
FIG. 3 illustrates a plan view showing a second recess of FIG. 1.
Figure 4:
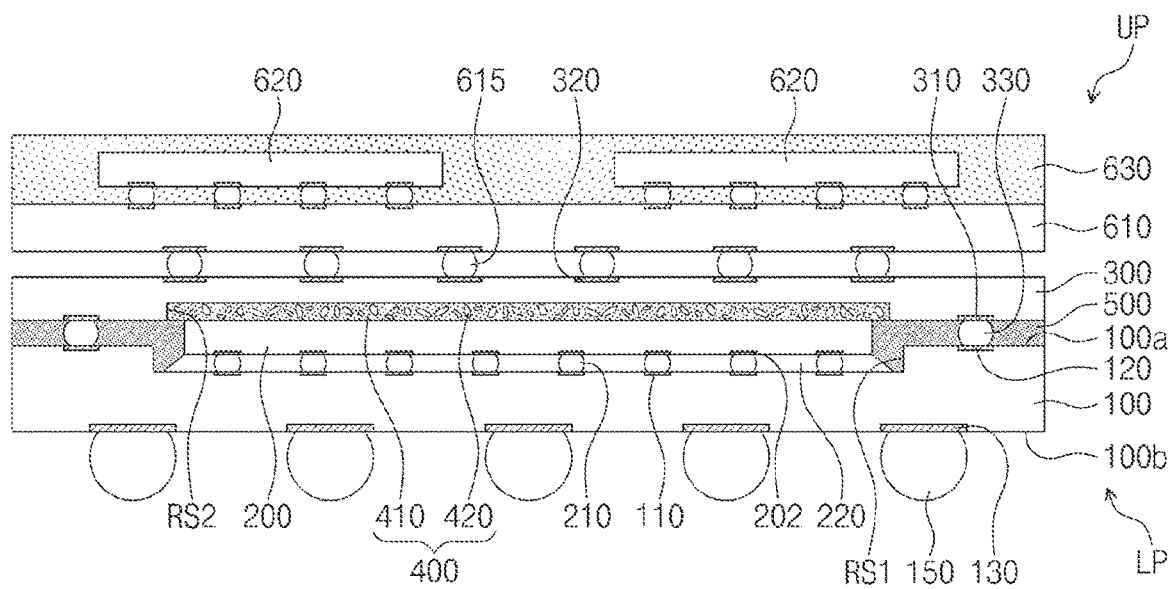
FIG. 4 illustrates a cross-sectional view showing a semiconductor package according to exemplary embodiments of the present inventive concept.

FIG. 1 illustrates a cross-sectional view showing a semiconductor package according to exemplary embodiments of the present inventive concept. FIG. 2 illustrates a plan view of a first recess depicted in FIG. 1, and shows a top view of a first package substrate and a first semiconductor chip. FIG. 3 illustrates a plan view of a second recess depicted in FIG. 1, and shows a bottom view of an interposer substrate and a first semiconductor chip. FIG. 4 illustrates a cross-sectional view showing a semiconductor package according to exemplary embodiments of the present inventive concept.

Referring to FIG. 1, a semiconductor package may have a package-on-package (POP) structure. For example, the semiconductor package may include a lower package LP and an upper package UP mounted on the lower package LP.

The lower package LP may include a first package substrate 100, a first semiconductor chip 200 mounted on the first package substrate 100, an interposer substrate 300 disposed on the first semiconductor chip 200, and a first molding layer 500 disposed on the first package substrate 100.

The first package substrate 100 may include a printed circuit board (PCB). The first package substrate 100 may also be referred to as a first substrate.

The first package substrate 100 may include a first recess RS1 formed on an upper portion thereof. The first recess RS1 may be a region in which a top surface 100a of the first package substrate 100 is recessed, and in which the first semiconductor chip 200 is received, as described below. The first recess RS1 may be formed in the top surface 100a of the first package substrate 100. A depth of about 5 μm to about 60 μm may be provided between the top surface 100a of the first package substrate 100 and a floor surface of the first recess RS1. Herein, the term "floor surface" of a recess may refer to the lowermost surface of the recess. For example, in an exemplary embodiment, a depth of about 10 μm to about 30 μm may be provided between the top surface 100a of the first package substrate 100 and the floor surface of the first recess RS1. From another view, the first package substrate 100 may have a circumferential part that protrudes upwards from the floor surface of the first recess RS1. A thickness of about 50 μm to about 100 μm may be provided between the floor surface of the first recess RS1 and a bottom surface 100b of the first package substrate 100. When viewed in a plan view, the first recess RS1 may be provided on a central part of the first package substrate 100. As shown in FIG. 2, the first recess RS1 may have a tetragonal shape or a polygonal shape when viewed in a plan view. However, the present inventive concept is not limited thereto. For example, according to exemplary embodiments, the planar shape of the first recess RS1 may correspond to that of the first semiconductor chip 200, which will be described below.

First substrate pads 110 and second substrate pads 120 may be disposed on the upper portion of the first package substrate 100. For example, the first substrate pads 110 may be disposed on the floor surface of the first recess RS1, and the second substrate pads 120 may be disposed on the top surface 100a of the first package substrate 100. Therefore, the second substrate pads 120 may be located at a higher level from the bottom surface 100b of the first package substrate 100 than that of the first substrate pads 110. For example, the distance between the second substrate pads 120 and the bottom surface 100b of the first package substrate 100 may be greater than the distance between the first substrate pads 110 and the bottom surface 100b of the first package substrate 100. The second substrate pads 120 may be spaced apart from the first recess RS1.

External terminals 150 may be disposed below the first package substrate 100. For example, the external terminals 150 may be placed on terminal pads 130 disposed on the bottom surface 100b of the first package substrate 100. The external terminals 150 may include, for example, solder balls or solder bumps, and based on the type of the external terminals 150, the semiconductor package may include one of, for example, a ball grid array (BGA) type, a fine ball-grid array (FBGA) type, and a land grid array (LGA) type.

The first semiconductor chip 200 may be disposed on the first package substrate 100. When viewed in a plan view, the first semiconductor chip 200 may be provided on the central part of the first package substrate 100. The first semiconductor chip 200 may overlap the first recess RS1. The first semiconductor chip 200 may be positioned in the first recess RS1 on the first package substrate 100. For example, when viewed in a plan view as shown in FIG. 2, the first semiconductor chip 200 may be disposed inside the first recess RS1. A distance of about 30 μm to about 600 μm may be provided between a lateral surface of the first semiconductor chip 200 and an inner lateral surface of the first recess RS1. As shown in FIG. 2, the first semiconductor chip 200 may have a tetragonal shape or a polygonal shape when viewed in a plan view. The planar shape of the first semiconductor chip 200 may correspond to that of the first recess RS1. The size of the planar shape of the first recess RS1 may be greater than that of the first semiconductor chip 200, thus allowing the first semiconductor chip 200 to be disposed in the first recess RS1.

The first semiconductor chip 200 may be mounted on the first package substrate 100. For example, the first semiconductor chip 200 may be flip-chip bonded to the first substrate pads 110 of the first package substrate 100. In this case, the first semiconductor chip 200 may be electrically connected to the first package substrate 100 through first chip terminals 210 such as, for example, solder balls or solder bumps. The first chip terminals 210 may be provided on chip pads 202 disposed on a bottom surface of the first semiconductor chip 200. In this description, the phrase "electrically connected to" may mean "directly or indirectly electrically connected to." The bottom surface of the first semiconductor chip 200, on which the chip pads 202 are provided, may be an active surface on which integrated circuits are formed, and a top surface of the first semiconductor chip 200 may be an inactive surface. The first semiconductor chip 200 may be a logic chip or a memory chip. In an exemplary embodiment, the memory chip may be DRAM, NAND Flash, NOR flash, PRAM, ReRAM, or MRAM. In an exemplary embodiment, the first semiconductor chip 200 may serve as a non-memory chip such as an application processor. The first semiconductor chip 200 may be electrically connected through the first package substrate 100 to the external terminals 150.

According to exemplary embodiments, as shown in FIG. 4, an under-fill layer 220 may fill a space between the first semiconductor chip 200 and the first package substrate 100. The under-fill layer 220 may surround the first chip terminals 210 between the first semiconductor chip 200 and the first package substrate 100. The under-fill layer 220 may protrude beyond the lateral surface of the first semiconductor chip 200. In an exemplary embodiment, a width of a top portion of the under-fill layer 220 may be greater than a width of a bottom portion of the under-fill layer 220, and the width of the under-fill layer 220 may gradually increase from the top portion toward the bottom portion. In an exemplary embodiment, the width of the top portion of the under-fill layer 220 may be about equal to the width of the first semiconductor chip 200, and the width of the bottom portion of the under-fill layer 220 may be greater than the width of the first semiconductor chip 200. The under-fill layer 220 may be spaced apart from the inner lateral surface of the first recess RS1. For example, the under-fill layer 220 may have a width greater than that of the first semiconductor chip 200 and less than that of the first recess RS1.

Referring back to FIG. 1, the interposer substrate 300 may be disposed on the first package substrate 100. In an exemplary embodiment, the interposer substrate 300 may include a dielectric substrate. In an exemplary embodiment, the interposer substrate 300 may include a printed circuit board (PCB). In an exemplary embodiment, the interposer substrate 300 may be formed of the same material as that of the first package substrate 100. In an exemplary embodiment, the interposer substrate 300 may include silicon (Si). The interposer substrate 300 may be disposed on the first semiconductor chip 200. The interposer substrate 300 may have a width greater than that of the first semiconductor chip 200. In this case, the interposer substrate 300 may protrude beyond a side of the first semiconductor chip 200. The interposer substrate 300 may have third substrate pads 310 disposed on a bottom surface thereof and fourth substrate pads 320 disposed on a top surface thereof. The third substrate pads 310 may be disposed at an outer part of the interposer substrate 300.

The interposer substrate 300 may be mounted on the first package substrate 100. The interposer substrate 300 and the first package substrate 100 may be electrically connected to each other through connection terminals 330. For example, the interposer substrate 300 may be flip-chip mounted on the first package substrate 100. In this case, the connection terminals 330 may include, for example, solder balls or solder bumps. The connection terminals 330 may connect the second substrate pads 120 of the first package substrate 100 to the third substrate pads 310 on the bottom surface of the interposer substrate 300. A distance of about 60 μm to about 200 μm may be provided between the top surface 100a of the first package substrate 100 and the bottom surface of the interposer substrate 300.

According to exemplary embodiments of the present inventive concept, the second substrate pads 120 of the first package substrate 100, to which the connection terminals 330 are coupled, may be located at a higher level than that of the first substrate pads 110 of the first package substrate 100, to which the chip terminals 210 of the first semiconductor chip 200 are coupled. A distance between the second substrate pads 120 and the bottom surface of the interposer substrate 300 may be less than a distance between the first substrate pads 110 and the bottom surface of the interposer substrate 300. For example, a small distance may be provided between the second substrate pads 120 and the third substrate pads 310, and the connection terminals 330 may stably connect the second substrate pads 120 to the third substrate pads 310. Accordingly, the semiconductor package may have improved electrical characteristics and enhanced structural stability.

The interposer substrate 300 may be attached to the top surface of the first semiconductor chip 200, which is disposed between the first package substrate 100 and the interposer substrate 300. The interposer substrate 300 may be attached to the top surface of the first semiconductor chip 200 through an adhesive layer 400 disposed between the interposer substrate 300 and the first semiconductor chip 200. For example, the adhesive layer 400 may be provided in a second recess RS2 formed on a lower portion of the interposer substrate 300.

The second recess RS2 may be a region in which the bottom surface of the interposer substrate 300 is recessed, and in which the adhesive layer 400 is received. The second recess RS2 may be formed in the bottom surface of the interposer substrate 300. A depth of about 10 μm to about 50 μm may be provided between the bottom surface of the interposer substrate 300 and a floor surface of the second recess RS2. In an exemplary embodiment, a depth of about 5 μm to about 30 μm may be provided between the bottom surface of the interposer substrate 300 and the floor surface of the second recess RS2. The first semiconductor chip 200 may overlap the second recess RS2. For example, when viewed in a plan view as shown in FIG. 3, the first semiconductor chip 200 may be disposed inside the second recess RS2. The second recess RS2 may have an inner lateral surface that is located on the same plane on which the lateral surface of the first semiconductor chip 200 is located, or that is spaced apart from the lateral surface of the first semiconductor chip 200. For example, according to exemplary embodiments, an inner lateral surface of the second recess RS2 may share a boundary with a lateral surface of the first semiconductor chip 200 (e.g., the lateral surfaces may be aligned with each other), or a space may exist between the inner lateral surface of the second recess RS2 and the lateral surface of the first semiconductor chip 200. The second recess RS2 may have a tetragonal shape or a polygonal shape when viewed in a plan view. However, the present inventive concept is not limited thereto. For example, according to exemplary embodiments, the planar shape of the second recess RS2 may correspond to that of the first semiconductor chip 200. The size of the planar shape of the second recess RS2 may be about equal to or greater than that of the first semiconductor chip 200.

The adhesive layer 400 may fill the second recess RS2. The adhesive layer 400 may be in contact (e.g., direct contact) with the inner lateral surface of the second recess RS2, the floor surface of the second recess RS2, and the top surface of the first semiconductor chip 200. As shown in FIGS. 1 and 3, when the size of the planar shape of the second recess RS2 is greater than that of the first semiconductor chip 200, the first semiconductor chip 200 may partially cover a central part at a bottom surface of the adhesive layer 400 and may partially expose a circumferential part at the bottom surface of the adhesive layer 400. From another view, the adhesive layer 400 may protrude from the lateral surface of the first semiconductor chip 200. The bottom surface of the adhesive layer 400 may be located at the same level as that of the bottom surface of the interposer substrate 300. Therefore, the top surface of the first semiconductor chip 200 may be located at the same level as that of the bottom surface of the interposer substrate 300. Alternatively, the bottom surface of the adhesive layer 400 may be located at a higher level than that of the bottom surface of the interposer substrate 300. Therefore, the top surface of the first semiconductor chip 200 may be located at a higher level than that of the bottom surface of the interposer substrate 300, and the first semiconductor chip 200 may have an upper portion that is partially inserted into the second recess RS2.

According to exemplary embodiments of the present inventive concept, the adhesive layer 400 may be used to attach the interposer substrate 300 to the first semiconductor chip 200. Accordingly, the semiconductor package may increase in structural stability. In addition, since the adhesive layer 400 is embedded in the interposer substrate 300, no interval, or a small interval, may be provided between the first semiconductor chip 200 and the interposer substrate 300. Further, a small interval may be provided between the first package substrate 100 and the interposer substrate 300. Accordingly, the semiconductor package may become compact-sized.

The adhesive layer 400 may include an adhesive member 410 that fills the second recess RS2 and thermal conductive members 420 that are distributed in the adhesive member 410.

The adhesive member 410 may have a film shape. The adhesive member 410 may include a non-conductive material. The adhesive member 410 may include an adhesive polymer. For example, the adhesive member 410 may include an acrylic polymer, an epoxy polymer, or a urethane polymer. However, the material of the adhesive member 410 is not limited thereto, and the adhesive member 410 may include any suitable adhesive polymer.

The thermal conductive members 420 may have, for example, bead, wire, or rod shapes. The thermal conductive members 420 may each have a length along its major axis less than an interval between the floor surface of the second recess RS2 and the top surface of the first semiconductor chip 200. The thermal conductive members 420 may be distributed in the adhesive member 410. The thermal conductive members 420 may have a volume fraction of about 1% to about 15% over the volume of the adhesive member 410. The thermal conductive members 420 may increase thermal conductivity of the adhesive member 410. Therefore, the adhesive layer 400 may have increased thermal conductivity. The thermal conductive members 420 may include a dielectric material. The thermal conductive members 420 may include a material whose thermal conductivity is high. For example, the thermal conductive members 420 may include at least one of amorphous silicon oxide ($SiO_2$), crystalline silicon oxide, aluminum oxide ($Al_2O_3$), magnesium oxide (MgO), zinc oxide (ZnO), silicon carbide (SiC), aluminum nitride (AlN), beryllium oxide (BeO), boron nitride (BN), and diamond. Additionally or alternatively, the thermal conductive members 420 may include a metallic material or a dielectric material whose thermal conductivity is high.

According to exemplary embodiments of the present inventive concept, the adhesive layer 400 may include the thermal conductive members 420 whose thermal conductivity is high, and the adhesive layer 400 may increase in thermal conductivity. Therefore, heat generated from the first semiconductor chip 200 may be efficiently discharged outwards through the interposer substrate 300, which may result in contribution to enhancement in thermal stability of the semiconductor package.

The first molding layer 500 may be provided on the first package substrate 100. The first molding layer 500 may fill a space between the first package substrate 100 and the interposer substrate 300. The first molding layer 500 may surround the connection terminals 330 on the top surface 100a of the first package substrate 100. The first molding layer 500 may enclose the first semiconductor chip 200 within the first recess RS1. For example, the first molding layer 500 may contact (e.g., directly contact) side surfaces and a lower surface of the first semiconductor chip 200, and the first semiconductor chip 200 may be disposed within and above the first recess RS1. As shown in FIGS. 1 and 3, when the size of the planar shape of the second recess RS2 is greater than that of the first semiconductor chip 200, the first molding layer 500 may be in contact (e.g., direct contact) with an exposed bottom surface of the adhesive layer 400. In addition, the first molding layer 500 may fill a space between the first semiconductor chip 200 and the floor surface of the first recess RS1. The first molding layer 500 may surround the first chip terminals 210 between the first semiconductor chip 200 and the floor surface of the first recess RS1. As shown in FIG. 4, when the under-fill layer 220 is provided between the first semiconductor chip 200 and the first package substrate 100, the first molding layer 500 may surround the under-fill layer 220 in the first recess RS1.

The upper package UP may be provided on the lower package LP. The upper package UP may include a second package substrate 610, a second semiconductor chip 620, and a second molding layer 630.

The second package substrate 610 may be disposed on the interposer substrate 300. The second package substrate 610 may be vertically spaced apart from the interposer substrate 300. The second package substrate 610 may be a printed circuit board (PCB) with signal patterns. Alternatively, the second package substrate 610 may have a structure in which at least one dielectric layer and at least one wiring layer are alternately stacked.

The second package substrate 610 may be mounted on the interposer substrate 300. For example, substrate terminals 615 may be disposed below the second package substrate 610. The substrate terminals 615 may be coupled to the fourth substrate pads 320 of the interposer substrate 300. The substrate terminals 615 may include, for example, solder balls or solder bumps.

One or more second semiconductor chips 620 may be disposed on the second package substrate 610. The second semiconductor chips 620 may be spaced apart from each other when viewed in a plan view. The second semiconductor chips 620 may be mounted on a top surface of the second package substrate 610. For example, the second semiconductor chips 620 may be flip-chip mounted on substrate pads of the second package substrate 610. For example, the second semiconductor chips 620 may be electrically connected to the second package substrate 610 through second chip terminals 622 such as, for example, solder balls or solder bumps. However, the present inventive concept is not limited thereto. For example, according to exemplary embodiments, the second semiconductor chips 620 may be mounted on the second package substrate 610 through bonding wires or any suitable mounting means. The second semiconductor chips 620 may be, for example, logic chips or memory chips. The second semiconductor chips 620 may be electrically connected to the external terminals 150 of the first package substrate 100 through the second package substrate 610 and the interposer substrate 300. Although FIG. 1 shows that two second semiconductor chips 620 are included, the present inventive concept is not limited thereto. For example, according to exemplary embodiments, one or three or more second semiconductor chips 620 may be provided.

The second molding layer 630 may be provided on the second package substrate 610. The second molding layer 630 may surround the second semiconductor chips 620 on the top surface of the second package substrate 610. For example, the second semiconductor chips 620 may be embedded in the second molding layer 630 on the second package substrate 610.

Figure 5:
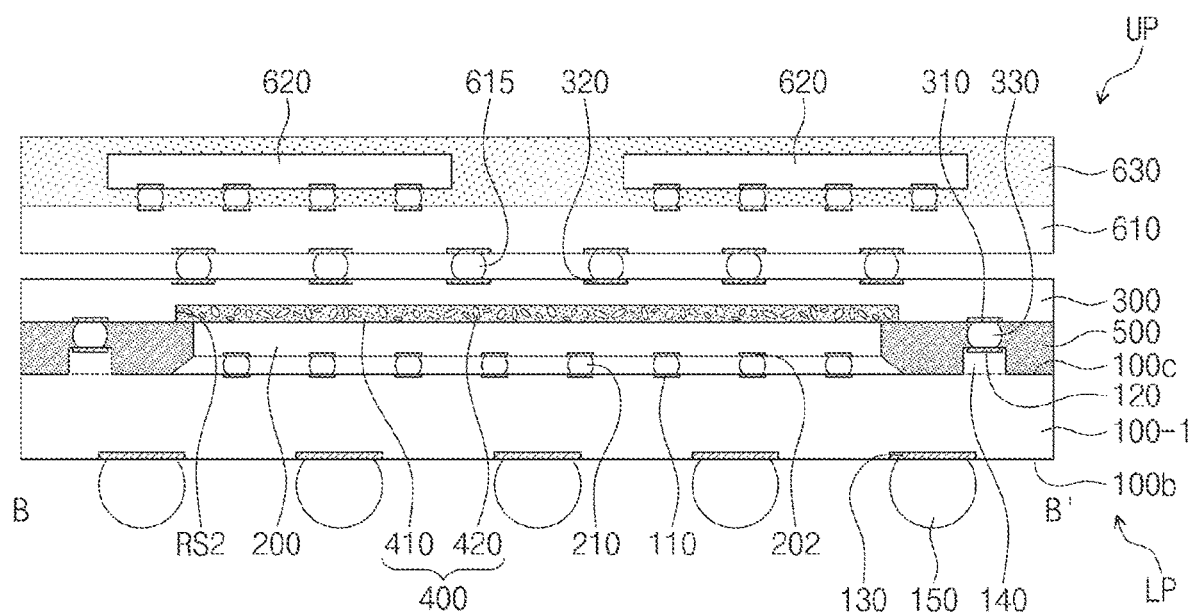
FIG. 5 illustrates a cross-sectional view showing a semiconductor package according to exemplary embodiments of the present inventive concept.
Figure 6:
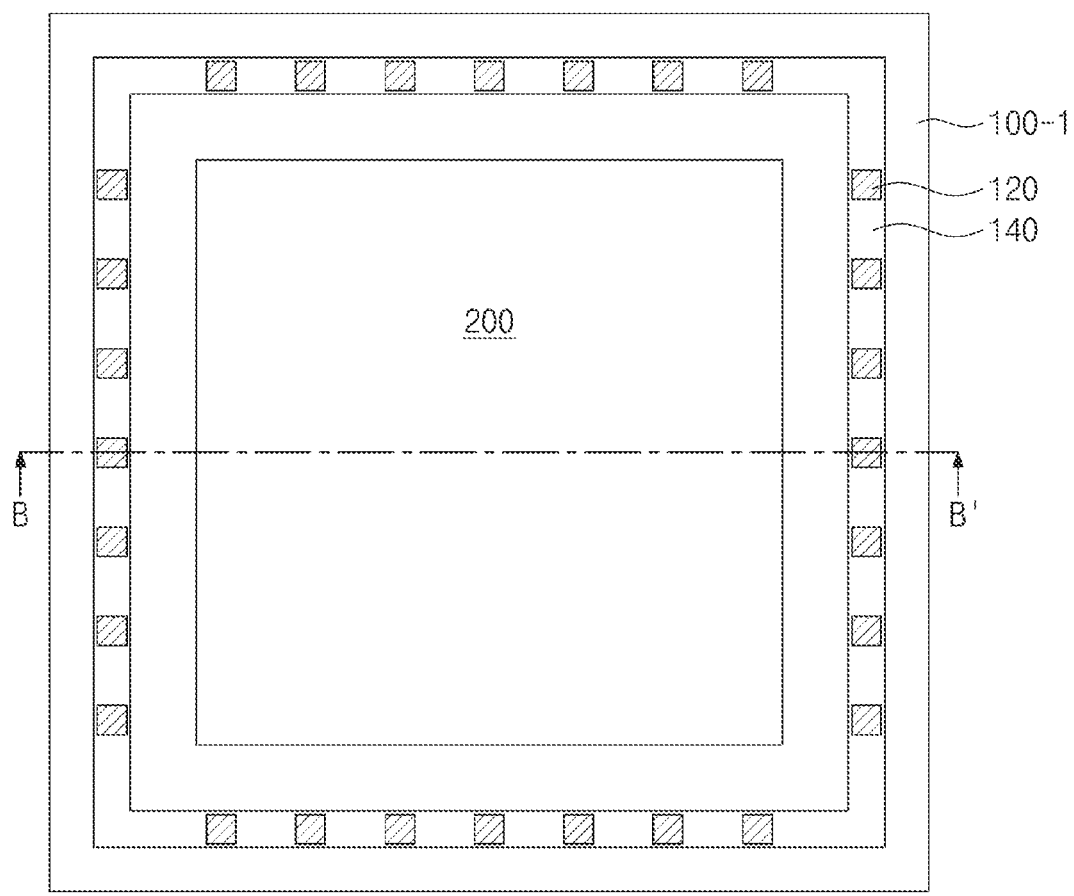
FIGS. 6 to 8 illustrate plan views showing a package substrate of FIG. 5.
Figure 7:
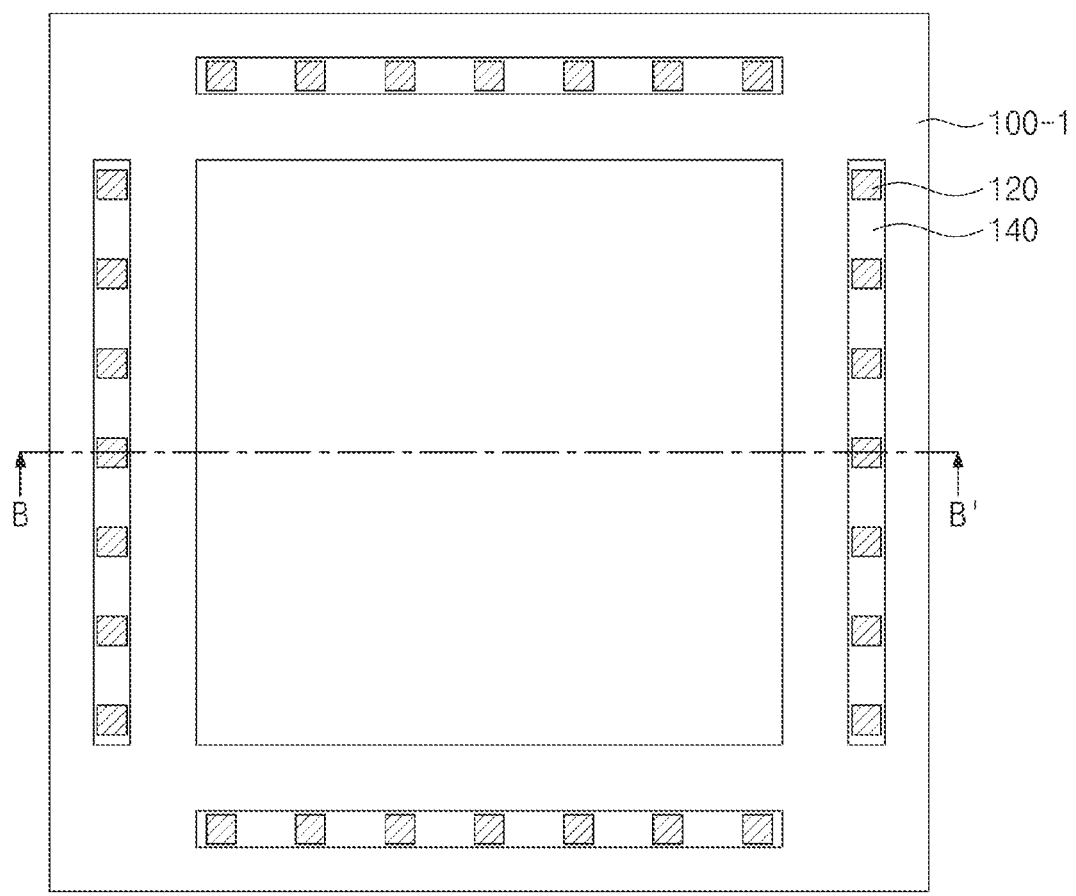
Figure 8:
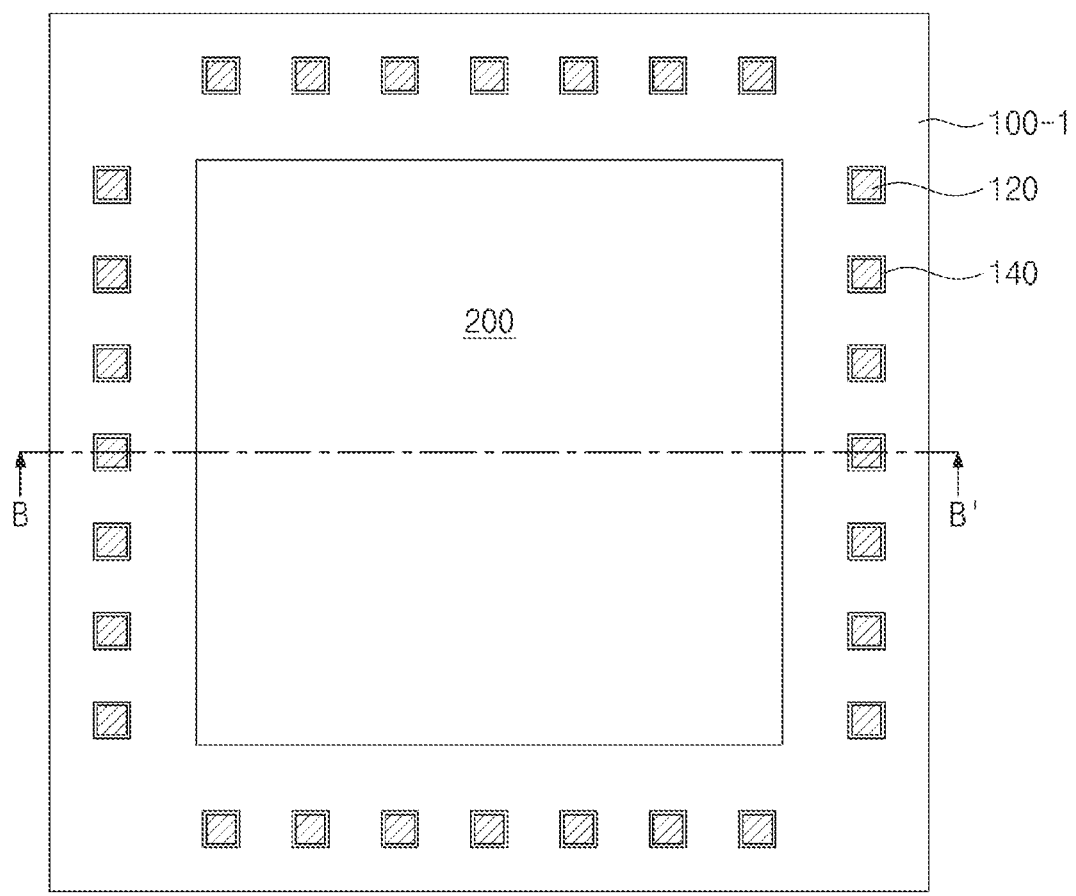

FIG. 5 illustrates a cross-sectional view showing a semiconductor package according to exemplary embodiments of the present inventive concept. FIGS. 6 to 8 illustrate plan views of a package substrate depicted in FIG. 5, showing a top view of a first package substrate and a first semiconductor chip.

For convenience of explanation, in describing the following figures, to the extent that a further description of elements and technical aspects is omitted, it may be assumed that these elements and technical aspects are at least similar to corresponding elements and technical aspects that have been described elsewhere in the present disclosure.

Referring to FIG. 5, in an exemplary embodiment, a first package substrate 100-1 does not include the first recess RS1 of FIG. 1. In this case, the first package substrate 100-1 may have a protruding portion 140 that extends toward the interposer substrate 300 from a top surface 100c of the first package substrate 100-1. A distance of about 5 μm to about 60 μm may be provided between the top surface 100c of the first package substrate 100-1 and a top surface of the protruding portion 140. The protruding portion 140 may be disposed on a circumferential part of the first package substrate 100-1. The protruding portion 140 may be disposed on a side of the first semiconductor chip 200. The protruding portion 140 may be spaced apart from the lateral surface of the first semiconductor chip 200. A distance of about 30 μm to about 600 μm may be provided between the protruding portion 140 and the lateral surface of the first semiconductor chip 200.

When viewed in a plan view, the protruding portion 140 may enclose the first semiconductor chip 200. For example, the protruding portion 140 may have a linear shape that extends along a lateral surface of the first semiconductor chip 200 which faces the protruding portion 140. When viewed in a plan view as shown in FIG. 6, the protruding portion 140 may have an annular shape that surrounds the first semiconductor chip 200. The first package substrate 100-1 may have a space surrounded by the protruding portion 140, and the space may correspond to the first recess RS1 discussed with reference to FIG. 1. For example, the first semiconductor chip 200 may be disposed in a region defined by the protruding portion 140. The protruding portion 140 may have a planar shape that corresponds to that of the first semiconductor chip 200. For example, when the planar shape of the first semiconductor chip 200 is a tetragonal shape, the planar shape of the protruding portion 140 may also be a tetragonal shape. The second substrate pads 120 of the first package substrate 100-1 may be disposed on the protruding portion 140. The second substrate pads 120 may be arranged on the top surface of the protruding portion 140 along a direction that surrounds the first semiconductor chip 200.

As shown in FIG. 7, in an exemplary embodiment, the protruding portion 140 may be provided in plural, and the plurality of protruding portions 140 may be provided on lateral surfaces of the first semiconductor chip 200. Each of the protruding portions 140 may have a linear shape that extends along a lateral surface of the first semiconductor chip 200 which the protruding portions 140 face. The second substrate pads 120 may be arranged on the top surface of the protruding portion 140 along an extending direction of the protruding portion 140 or along a direction substantially parallel to the lateral surface of the first semiconductor chip 200.

In an exemplary embodiment, as shown in FIG. 8, the protruding portion 140 may be provided in plural, and the plurality of protruding portions 140 may be provided along lateral surfaces of the first semiconductor chip 200. Each of the protruding portions 140 may have a pillar shape directed toward the interposer substrate 300 from the top surface 100c of the first package substrate 100-1. In an exemplary embodiment, the pillar shape may extend along a lateral surface of the first semiconductor chip 200 which faces the protruding portion 140. On the lateral surface of the first semiconductor chip 200, the protruding portions 140 may be arranged spaced apart from each other in a direction substantially parallel to the lateral surface of the first semiconductor chip 200. The second substrate pads 120 may each be disposed on the top surface of the protruding portion 140.

The under-fill layer 220 may fill a space between the first semiconductor chip 200 and the first package substrate 100-1. The under-fill layer 220 may surround the first chip terminals 210 between the first semiconductor chip 200 and the first package substrate 100-1. The under-fill layer 220 may protrude beyond the lateral surface of the first semiconductor chip 200. The under-fill layer 220 may be disposed between the protruding portions 140.

According to exemplary embodiments of the present inventive concept, the second substrate pads 120 positioned on the protruding portion 140 of the first package substrate 100-1 may be located at a higher level than that of the first substrate pads 110 of the first package substrate 100-1. A distance between the second substrate pads 120 and the bottom surface of the interposer substrate 300 may be less than a distance between the first substrate pads 110 and the bottom surface of the interposer substrate 300. For example, a small distance may be provided between the second substrate pads 120 and the third substrate pads 310, and the connection terminals 330 may stably connect the second substrate pads 120 to the third substrate pads 310. Accordingly, the semiconductor package may have improved electrical characteristics and enhanced structural stability.

Figure 9:
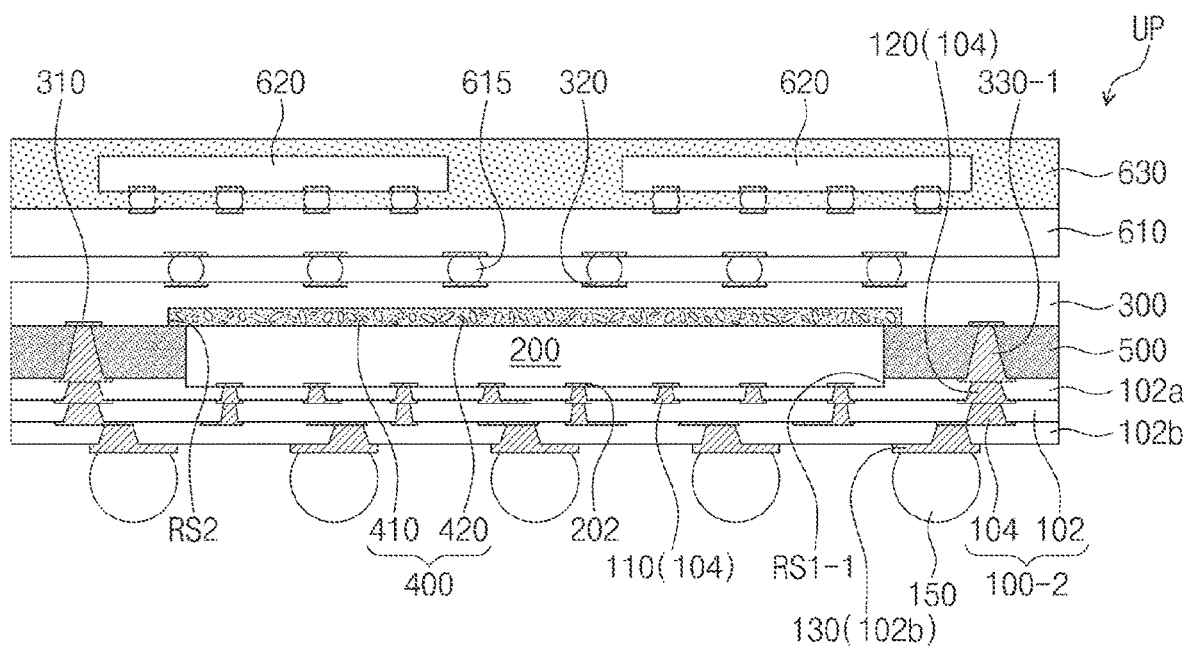
FIG. 9 illustrates a cross-sectional view showing a semiconductor package according to exemplary embodiments of the present inventive concept.

FIG. 9 illustrates a cross-sectional view showing a semiconductor package according to exemplary embodiments of the present inventive concept.

Referring to FIG. 9, a first package substrate 100-2 may include a redistribution substrate. For example, the first package substrate 100-2 may include a plurality of dielectric patterns 102 that is sequentially stacked and a plurality of wiring patterns 104 embedded in the dielectric patterns 102. The first package substrate 100-2 may include a first recess RS1-1 formed on an upper portion thereof. For example, the first recess RS1-1 may be formed by partially removing an uppermost dielectric pattern 102a of the dielectric patterns 102. A depth of about 5 μm to about 60 μm may be provided between a top surface of the first package substrate 100-2 and a floor surface of the first recess RS1-1. A lowermost dielectric pattern 102b of the dielectric patterns 102 may expose portions of the wiring patterns 104, and the exposed wiring patterns 104 may correspond to the terminal pads 130 that connect the external terminals 150 to the first package substrate 100-2. The uppermost dielectric pattern 102a of the dielectric patterns 102 may expose portions of the wiring patterns 104, in which wiring patterns 104 exposed on the floor surface of the first recess RS1-1 may correspond to the first substrate pads 110 on which the first semiconductor chip 200 is mounted, and in which wiring patterns 104 exposed on the top surface of the first package substrate 100-2 may correspond to the second substrate pads 120 on which the interposer substrate 300 is mounted.

The first semiconductor chip 200 may be disposed on the first package substrate 100-2. When viewed in a plan view, the first semiconductor chip 200 may be provided on a central part of the first package substrate 100-2. The first semiconductor chip 200 may have a lower portion that is partially inserted into the first recess RS1-1. The first semiconductor chip 200 may have the same width and planar shape as those of the first recess RS1-1. For example, the lateral surface of the first semiconductor chip 200 may be in contact (e.g., direct contact) with an inner lateral surface of the first recess RS1-1. The lateral surface of the first semiconductor chip 200 may be covered with the uppermost dielectric pattern 102a of the dielectric patterns 102 of the first package substrate 100-2. The bottom surface of the first semiconductor chip 200 may be in contact (e.g., direct contact) with the floor surface of the first recess RS1-1. The first semiconductor chip 200 may be mounted on the first package substrate 100-2. For example, a direct bonding method may be used to couple the first semiconductor chip 200 to the first substrate pads 110 of the first package substrate 100-2. In this case, the chip pads 202 of the first semiconductor chip 200 may be in direct contact with the first substrate pads 110 of the first package substrate 100-2.

The interposer substrate 300 may be mounted on the first package substrate 100-2. Through electrodes 330-1 may be used to electrically connect the interposer substrate 300 to the first package substrate 100-2. The through electrodes 330-1 may be through vias that vertically penetrate the first molding layer 500. For example, the through electrodes 330-1 may penetrate the first molding layer 500 that fills a space between the first package substrate 100-2 and the interposer substrate 300, and may be coupled to the second substrate pads 120 of the first package substrate 100-2. The through electrodes 330-1 may include the same material as that of the second substrate pads 120. Portions of the through electrodes 330-1 may extend into the uppermost dielectric pattern 102a. The widths of the through electrodes 330-1 may decrease in a direction from the first package substrate 100-2 toward the interposer substrate 300. In an exemplary embodiment, a seed layer may be provided between the first molding layer 500 and each of the through electrodes 330-1. The through electrodes 330-1 may be coupled to the third substrate pads 310 of the interposer substrate 300.

FIGS. 10 to 16 illustrate cross-sectional views showing a method of fabricating a semiconductor package according to exemplary embodiments of the present inventive concept.

Figure 10:
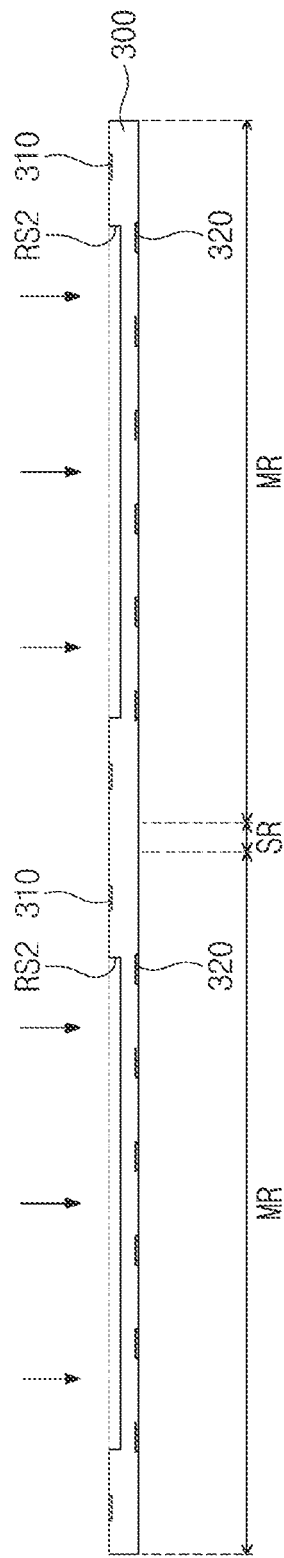
FIGS. 10 to 16 illustrate cross-sectional views showing a method of fabricating a semiconductor package according to exemplary embodiments of the present inventive concept.

Referring to FIG. 10, an interposer substrate 300 may be provided. The interposer substrate 300 may include third substrate pads 310 provided on a top surface thereof and fourth substrate pads 320 provided on a bottom surface thereof.

Second recesses RS2 may be formed on the interposer substrate 300. The second recesses RS2 may be formed in corresponding mounting regions MR. The second recesses RS2 may be formed in the top surface of the interposer substrate 300. The mounting regions MR may be spaced apart from each other across a separation region SR. In this description, the mounting regions MR may indicate zones in which semiconductor packages are correspondingly formed, and the separation region SR may indicate a zone in which a sawing process is performed to divide the semiconductor packages from each other.

Figure 11:
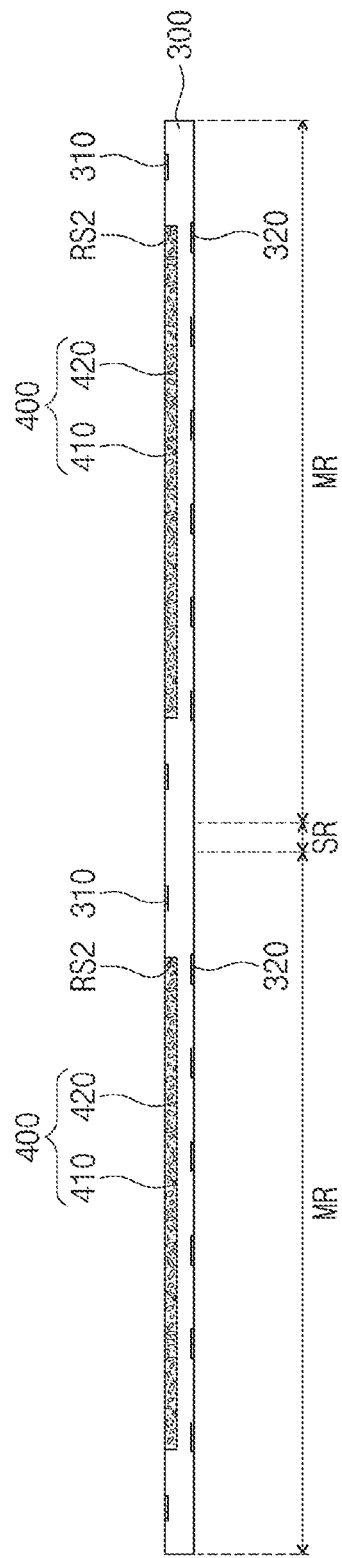

Referring to FIG. 11, adhesive layers 400 may fill the second recesses RS2. In an exemplary embodiment, a fluid adhesive member 410 mixed with thermal conductive members 420 may be introduced into the second recesses RS2, and then the adhesive member 410 may be cured to form the adhesive layers 400. In an exemplary embodiment, film-shaped adhesive layers 400, each of which may include the thermal conductive members 420 distributed in the adhesive member 410, may be provided in the second recesses RS2. In an exemplary embodiment, top surfaces of the adhesive layers 400 may be substantially coplanar with the top surface of the interposer substrate 300. In an exemplary embodiment, top surfaces of the adhesive layers 400 may be disposed at a lower level than the top surface of the interposer substrate 300.

Figure 12:
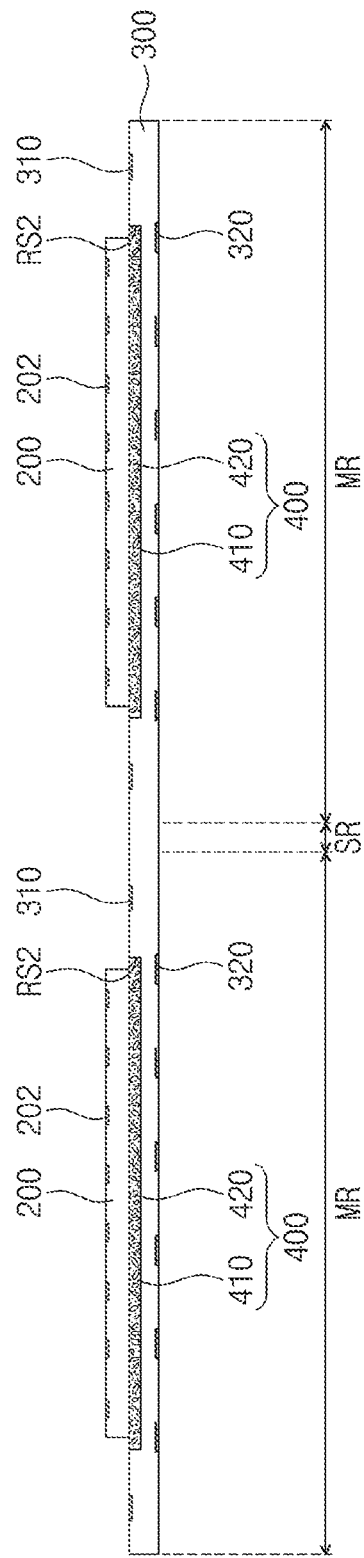

Referring to FIG. 12, first semiconductor chips 200 may be attached to the interposer substrate 300. For example, the first semiconductor chips 200 may be disposed in corresponding mounting regions MR. The first semiconductor chips 200 may be positioned on the interposer substrate 300 such that their inactive surfaces face the interposer substrate 300. Subsequently, the inactive surfaces of the first semiconductor chips 200 may be attached to the adhesive layers 400. When viewed in a plan view, the first semiconductor chips 200 may be attached to the interposer substrate 300, such that the first semiconductor chips 200 may each be positioned in an area within the adhesive layer 400.

According to exemplary embodiments of the present inventive concept, the adhesive layers 400 may be placed in the second recesses RS2 of the interposer substrate 300, and thus a small height may be given to a structure where the first semiconductor chips 200 are attached to the interposer substrate 300. Therefore, a compact-sized semiconductor package may be fabricated.

Figure 13:
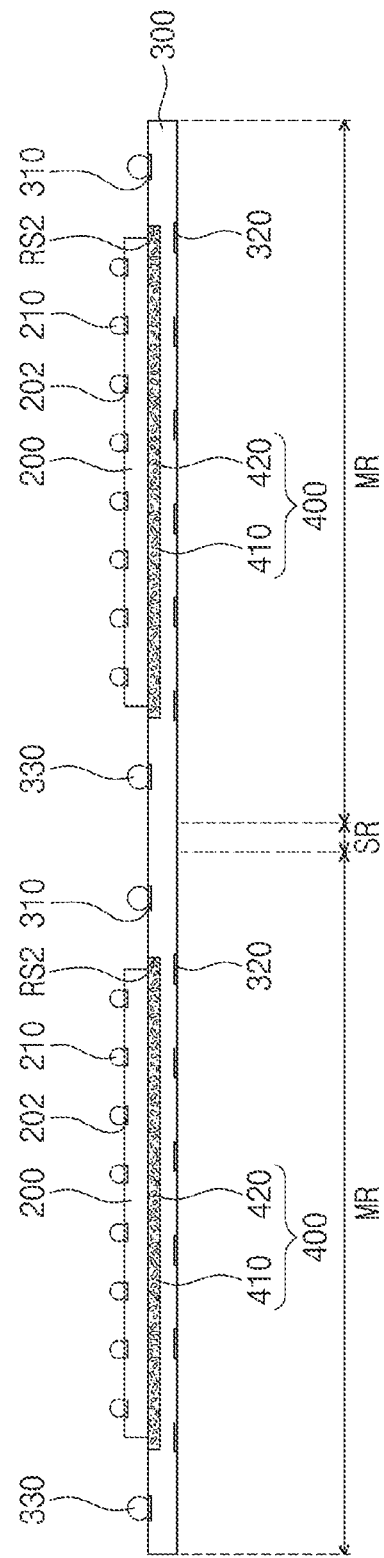

Referring to FIG. 13, connection terminals 330 and first chip terminals 210 may be provided on the interposer substrate 300. The connection terminals 330 may be attached to the interposer substrate 300, and the first chip terminals 210 may be attached to the first semiconductor chips 200. For example, the connection terminals 330 and the first chip terminals 210 may be formed by attaching soldering members, such as solder balls, to chip pads 202 and third substrate pads 310. The connection terminals 330 may be attached to corresponding third substrate pads 310 of the interposer substrate 300, and the first chip terminals 210 may be attached to the chip pads 202 of the first semiconductor chips 200. The connection terminals 330 may be formed together with the first chip terminals 210 in a process of forming the first chip terminals 210, or may be formed separately from the first chip terminals 210.

Figure 14:
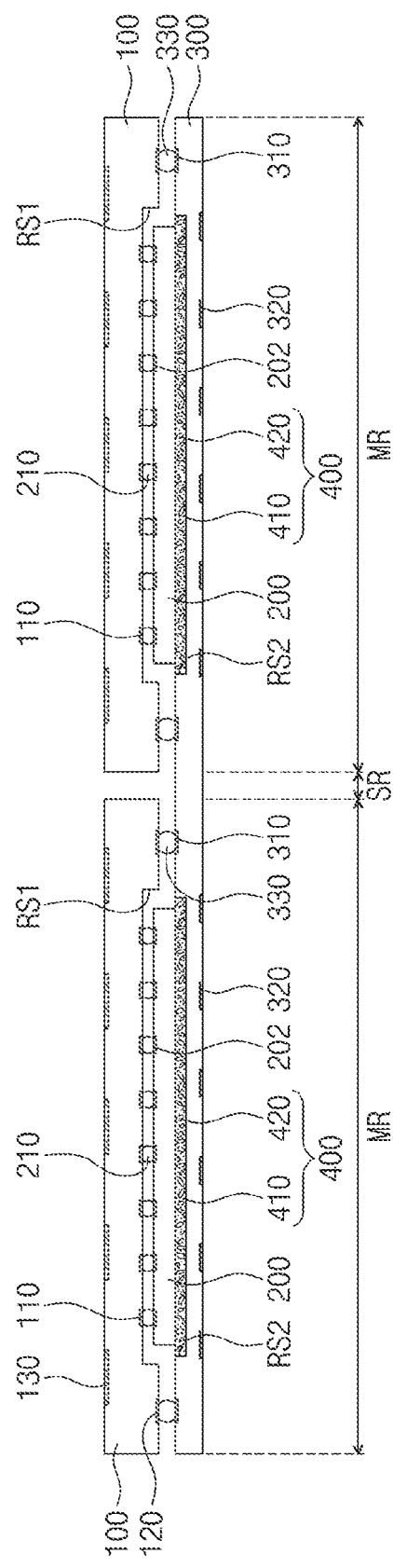

Referring to FIG. 14, first package substrates 100 may be provided on the interposer substrate 300. Each of the first package substrates 100 may have a first recess RS1 formed on a lower portion thereof. The first package substrate 100 may include, at its lower portion, first substrate pads 110 and second substrate pads 120. The first substrate pads 110 may be disposed on a floor surface of the first recess RS1. The second substrate pads 120 may be disposed on a bottom surface of the first package substrate 100.

The first package substrates 100 may be disposed in corresponding mounting regions MR. The first package substrates 100 may be disposed such that their first recesses RS1 are placed on corresponding first semiconductor chips 200. Here, the first substrate pads 110 may be disposed to vertically correspond to the chip pads 202 of the first semiconductor chip 200, and the second substrate pads 120 may be disposed to vertically correspond to the third substrate pads 310 of the interposer substrate 300.

Subsequently, the first package substrates 100 may be mounted on the interposer substrate 300 and the first semiconductor chips 200. For example, the first package substrates 100 may be disposed on the interposer substrate 300 such that the first chip terminals 210 contact (e.g., directly contact) corresponding chip pads 202 and such that the connection terminals 330 contact (e.g., directly contact) corresponding third substrate pads 310. Here, the first semiconductor chips 200 may be inserted into corresponding first recesses RS1 of the first package substrates 100. Thereafter, the first chip terminals 210 and the connection terminals 330 may undergo a reflow process to connect the chip pads 202 to the first substrate pads 110 and to connect the third substrate pads 310 to the second substrate pads 120.

According to exemplary embodiments, before the first package substrates 100 are mounted, an under-fill layer may be provided on top surfaces of the first semiconductor chips 200. After the reflow process, the under-fill layer may fill a space between the first semiconductor chip 200 and the floor surface of the first recess RS1 of the first package substrate 100. In this case, the semiconductor package described with reference to FIG. 2 may be fabricated. The following description refers to the exemplary embodiment of FIG. 14.

Referring to a comparative example, when the first recesses RS1 are not formed on the first package substrates 100, disposing the first semiconductor chips 200 between the first package substrates 100 and the interposer substrate 300 may cause an increase in distance between the third substrate pads 310 and the second substrate pads 120. In this case, upper connection terminals may be utilized on the third substrate pads 310 and lower connection terminals may be utilized on the second substrate pads 120 to connect the third substrate pads 310 to the second substrate pads 120. However, in this case, in the reflow process, it may be difficult to achieve proper alignment between the upper connection terminals and the lower connection terminals. In addition, a large amount of soldering material may be contained in connection terminals that are formed by merging the upper connection terminals with the lower connection terminals, and as a result, in the reflow process, bridge issues may occur between the connection terminals and their adjacent connection terminals or pads.

In contrast, according to exemplary embodiments of the present inventive concept, since the first semiconductor chips 200 are inserted into the first recesses RS1 of the first package substrates 100, a small interval may be provided between the third substrate pads 310 and the second substrate pads 120. The third substrate pad 310 and the second substrate pad 120 may be connected to each other through a single connection terminal 330 provided therebetween. Accordingly, the third substrate pads 310 may be properly aligned with and efficiently connected to the second substrate pads 120, and a connection failure between the third substrate pads 310 and the second substrate pads 120 may be prevented.

Figure 15:
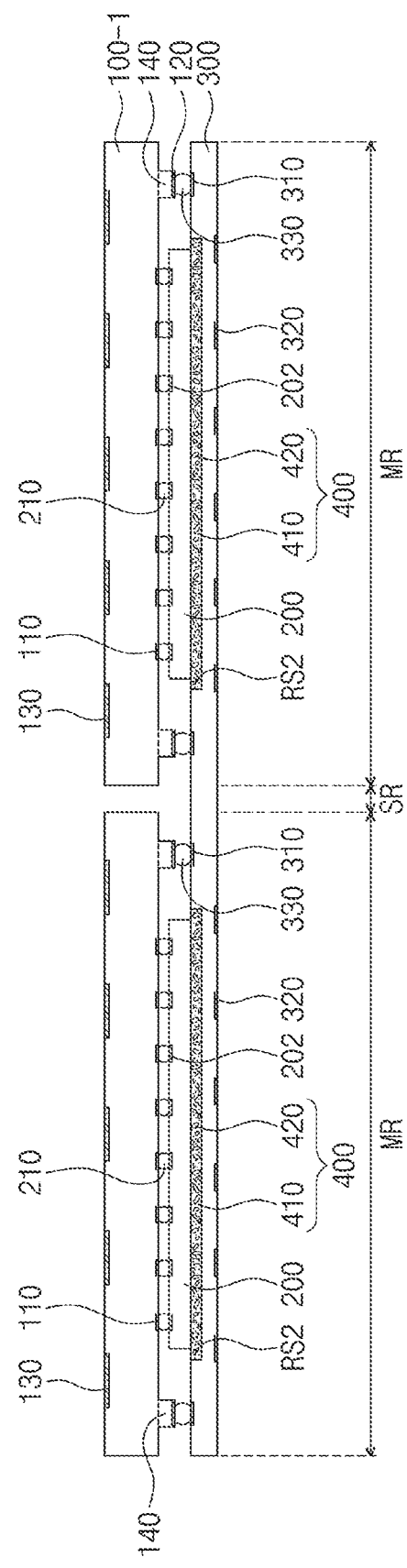

According to exemplary embodiments, as shown in FIG. 15, first package substrates 100-1 may include protruding portions 140, each of which protrudes from a bottom surface of its corresponding first package substrate 100-1. The first substrate pads 110 may be disposed on a bottom surface of the first package substrate 100-1. The second substrate pads 120 may be disposed on bottom surfaces of the protruding portions 140. The first package substrates 100-1 may be mounted on the interposer substrate 300. For example, the first package substrates 100-1 may be disposed on the interposer substrate 300 such that the first chip terminals 210 contact (e.g., directly contact) corresponding chip pads 202 and such that the connection terminals 330 contact (e.g., directly contact) corresponding third substrate pads 310. Here, when viewed in a plan view, the first semiconductor chips 200 may be positioned between the protruding portions 140. Thereafter, the first chip terminals 210 and the connection terminals 330 may undergo a reflow process to connect the chip pads 202 to the first substrate pads 110 and to connect the third substrate pads 310 to the second substrate pads 120.

According to exemplary embodiments of the present inventive concept, since the second substrate pads 120 are formed on the bottom surfaces of the protruding portions 140, a small interval may be provided between the third substrate pads 310 and the second substrate pads 120. The third substrate pad 310 and the second substrate pad 120 may be connected to each other through a single connection terminal 330 provided therebetween. Accordingly, the third substrate pads 310 may be properly aligned with and efficiently connected to the second substrate pads 120, and a connection failure between the third substrate pads 310 and the second substrate pads 120 may be prevented. The following description refers to the exemplary embodiment of FIG. 14.

Figure 16:
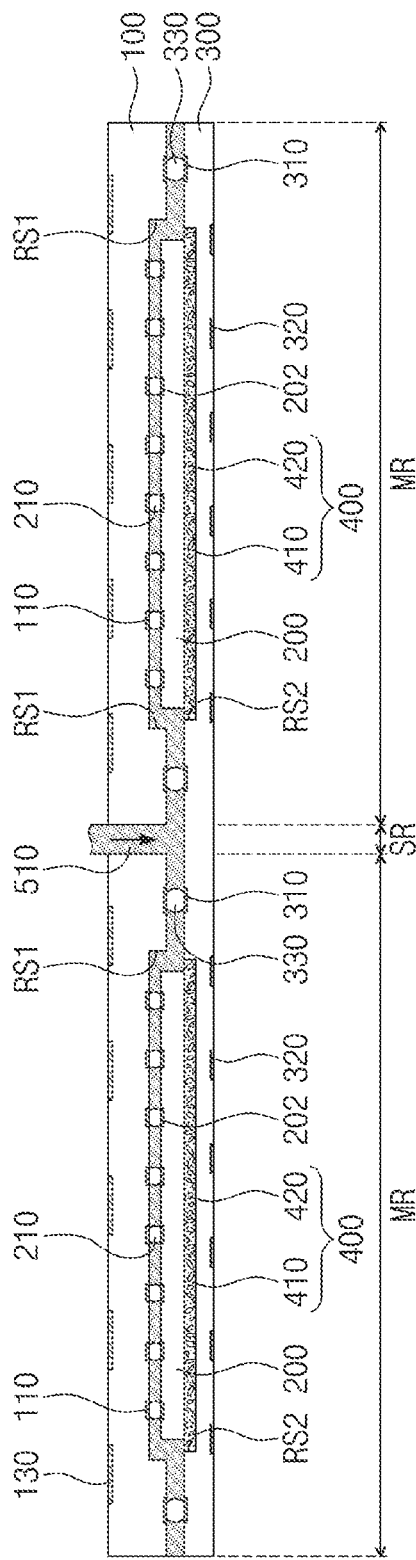

Referring to FIG. 16, a first molding layer (see 500 of FIG. 1) may be formed between the interposer substrate 300 and the first package substrates 100. For example, a molding member 510 may be introduced through a space between the first package substrates 100. The molding member 510 may fill a space between the interposer substrate 300 and the first package substrates 100.

Subsequently, the molding member 510 may be cured to form the first molding layer 500 of FIG. 1.

Referring back to FIG. 1, a process such as, for example, a sawing process, may be performed to form lower packages LP. The sawing process may simultaneously cut the interposer substrate 300 and the first molding layer 500. The sawing process may be executed on the separation region SR.

An upper package UP may be mounted on the lower package LP. The upper package UP may include a second package substrate 610, a second semiconductor chip 620, and a second molding layer 630. Substrate terminals 615 on a bottom surface of the second package substrate 610 may be used to mount the upper package UP on the lower package LP.

Subsequently, external terminals 150 may be provided below the first package substrate 100. The processes described above may be performed to fabricate the semiconductor package described with reference to FIG. 1.

Figure 17:
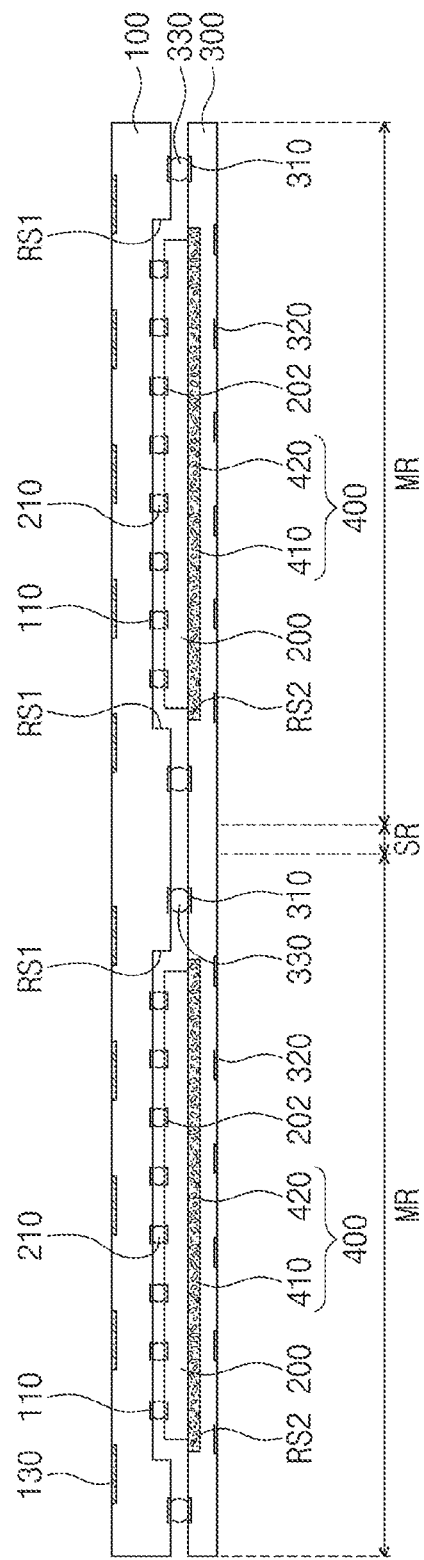

FIGS. 17 and 18 illustrate cross-sectional views showing a method of fabricating a semiconductor package according to exemplary embodiments of the present inventive concept.

Referring to FIG. 17, a first package substrate 100 may be provided on a resultant structure of FIG. 13. The first package substrate 100 may cover the mounting regions MR and the separation region SR. The first package substrate 100 may have first recesses RS1 formed on a lower portion thereof. The first package substrate 100 may be disposed such that the first recesses RS1 are placed on corresponding first semiconductor chips 200.

Subsequently, the first package substrate 100 may be mounted on the interposer substrate 300 and the first semiconductor chips 200. The first semiconductor chips 200 may be inserted into corresponding first recesses RS1 of the first package substrate 100. Subsequently, the first chip terminals 210 and the connection terminals 330 may undergo a reflow process to connect the chip pads 202 to the first substrate pads 110 and to connect the third substrate pads 310 to the second substrate pads 120.

Referring to FIG. 18, a first molding layer (see 500 of FIG. 1) may be formed between the interposer substrate 300 and the first package substrate 100. For example, a molding member 510 may be introduced into a space between the interposer substrate 300 and the first package substrate 100. The molding member 510 may fill the space between the interposer substrate 300 and the first package substrate 100. Subsequently, the molding member 510 may be cured to form the first molding layer 500 of FIG. 1.

Referring again to FIG. 1, a process such as, for example, a sawing process, may be performed to form lower packages LP. The sawing process may simultaneously cut the interposer substrate 300, the first molding layer 500, and the first package substrate 100. The sawing process may be executed on the separation region SR.

Subsequently, an upper package UP may be mounted on the lower package LP.

FIGS. 19 to 22 illustrate cross-sectional views showing a method of fabricating a semiconductor package according to exemplary embodiments of the present inventive concept.

Referring to FIG. 19, first semiconductor chips 200 may be attached to an interposer substrate 300. For example, the first semiconductor chips 200 may be disposed in corresponding mounting regions MR. The first semiconductor chips 200 may be positioned on the interposer substrate 300 such that the inactive surfaces of the first semiconductor chips 200 face the interposer substrate 300. Subsequently, the inactive surfaces of the first semiconductor chips 200 may be attached to adhesive layers 400.

Figure 20:
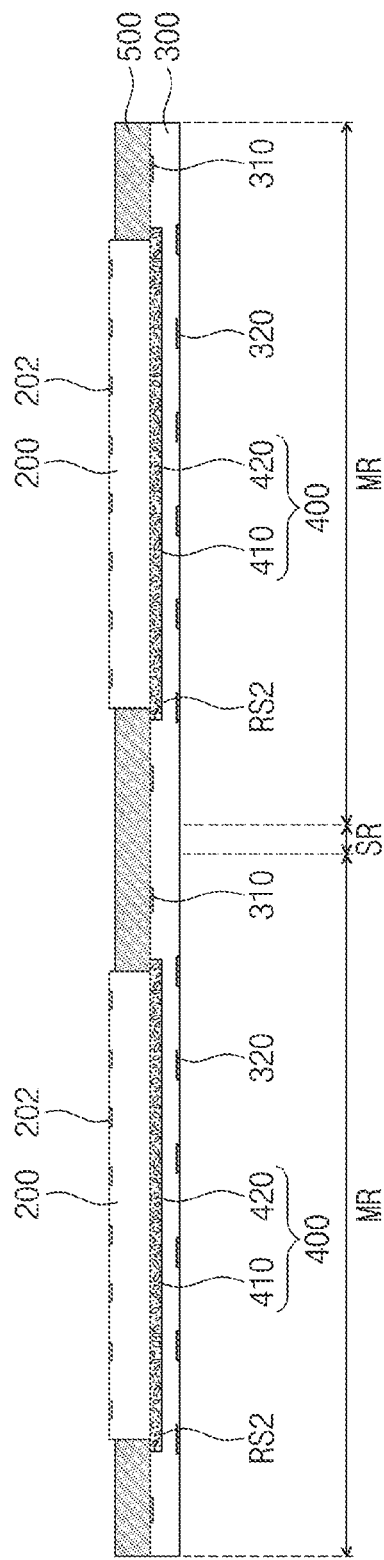

Referring to FIG. 20, a first molding layer 500 may be formed on the interposer substrate 300. The first molding layer 500 may be formed by coating a dielectric material on the interposer substrate 300. The dielectric material may be coated to surround the first semiconductor chips 200 on the interposer substrate 300. The first molding layer 500 may cover lateral surfaces of the first semiconductor chips 200. Here, the first molding layer 500 may be formed to have a top surface at a lower level than that of top surfaces of the first semiconductor chips 200. For example, the first semiconductor chips 200 may protrude from the top surface of the first molding layer 500.

Figure 21:
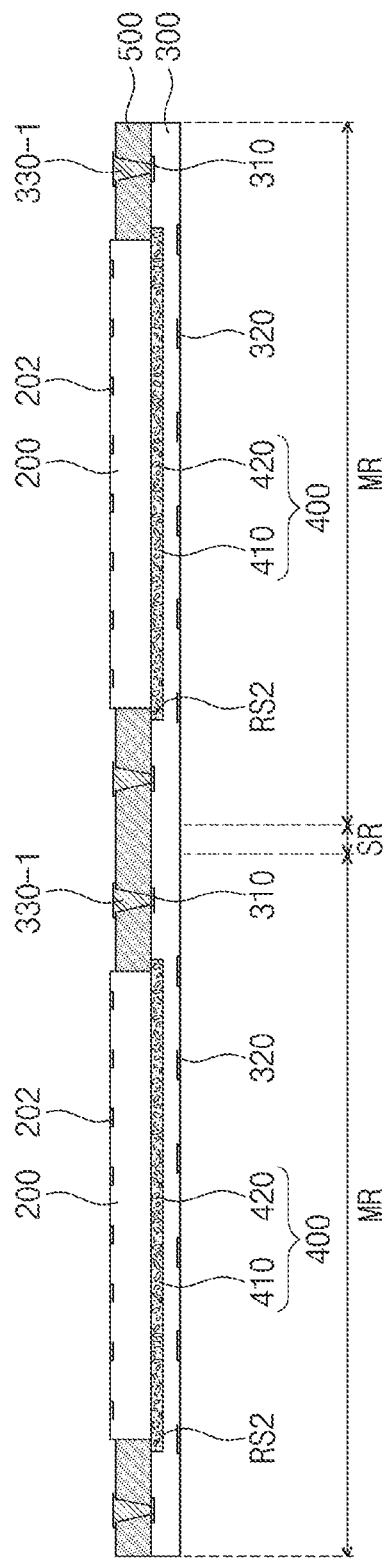

Referring to FIG. 21, via holes may be formed on the first molding layer 500. For example, a mask pattern may be formed on the first molding layer 500, and then the first molding layer 500 may undergo an etching process in which the mask pattern is used as an etching mask to form the via holes. The via holes may be formed to each have a width that decreases in a direction toward the interposer substrate 300. The via holes may penetrate the first molding layer 500 and may expose third substrate pads 310 of the interposer substrate 300.

Through electrodes 330-1 may be formed in the via holes. For example, a seed layer may be formed along inner lateral surfaces and bottom surfaces of the via holes. Subsequently, a plating process may be performed in which the seed layer is used as a seed. The plating process may fill the via holes with a metallic material, and the metallic material filling the via holes may constitute the through electrodes 330-1. The plating process may include a metal electroless plating process or a metal electroplating process. The widths of the through electrodes 330-1 may decrease in a direction toward the interposer substrate 300. The through electrodes 330-1 may be coupled to the third substrate pads 310 of the interposer substrate 300. The through electrodes 330-1 may be formed to have portions that extend onto the top surface of the first molding layer 500. The portion of the through electrode 330-1 that extends onto the top surface of the first molding layer 500 may serve as a pad to which a wiring pattern 104 is coupled in a subsequent process.

Figure 22:
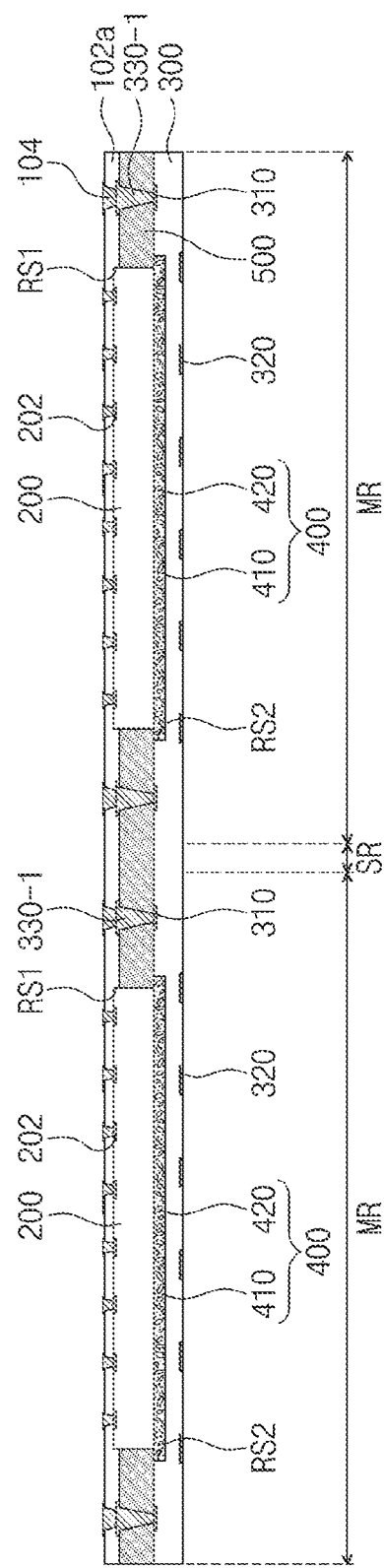

Referring to FIG. 22, a dielectric pattern 102a may be formed on the interposer substrate 300. For example, the dielectric pattern 102a may be formed by depositing or coating a dielectric material on the first molding layer 500 and the first semiconductor chips 200. The dielectric pattern 102a may cover the first molding layer 500 and the first semiconductor chips 200. The dielectric pattern 102a may cover top and lateral surfaces of the first semiconductor chips 200. For example, upper portion of the first semiconductor chips 200 may be partially inserted into the dielectric pattern 102a. Chip pads 202 of the first semiconductor chips 200 and the through electrodes 330-1 may be embedded in the dielectric pattern 102a. The dielectric pattern 102a may correspond to the uppermost dielectric pattern 102a of the first package substrate 100-2 described with reference to FIG. 9.

A wiring pattern 104 may be formed on the interposer substrate 300. For example, a patterning process may be performed on the dielectric pattern 102a. The patterning process may expose the chip pads 202 of the first semiconductor chips 200 and the through electrodes 330-1. Subsequently, a conductive layer may be formed on the dielectric pattern 102a, and the conductive layer may be patterned to form the wiring pattern 104. The wiring pattern 104 may have patterns that are coupled to corresponding chip pads 202 of the first semiconductor chip 200 and to corresponding through electrodes 330-1. The wiring pattern 104 may correspond to an uppermost wiring pattern 104 of the first package substrate 100-2 described with reference to FIG. 9.

According to exemplary embodiments of the present inventive concept, the first molding layer 500 may be formed to have a thickness less than those of the first semiconductor chips 200, and the through electrodes 330-1 may be formed to penetrate the first molding layer 500. Therefore, according to exemplary embodiments of the present inventive concept, the occurrence of an electrical short caused by when a conductive material does not fill the via holes of the first molding layer 500 may be reduced or prevented. Moreover, the first semiconductor chips 200 may be formed to be embedded in the dielectric pattern 102a, and a small distance may be provided between the wiring pattern 104 and the third substrate pads 310 of the interposer substrate 300. Accordingly, a semiconductor package having improved electrical characteristics may be provided.

The formation of the dielectric pattern 102a and the wiring pattern 104 may be repeatedly performed on a resultant structure of FIG. 22. A plurality of stacked dielectric patterns 102 and a plurality of wiring patterns 104 may constitute the first package substrate 100-2 of FIG. 9.

A process such as, for example, a sawing process, may be performed to form lower packages LP. The sawing process may simultaneously cut the interposer substrate 300, the first molding layer 500, and the first package substrate 100-2. The sawing process may be executed on the separation region SR.

Subsequently, an upper package UP may be mounted on the lower package LP. The process described above may be performed to fabricate the semiconductor package described with reference to FIG. 9.

According to exemplary embodiments of the present inventive concept, a semiconductor package may be configured such that a small distance is provided between second substrate pads and third substrate pads, and such that connection terminals stably connect the second substrate pads to the third substrate pads. Accordingly, a semiconductor package having improved electrical characteristics and enhanced structural stability may be provided.

According to exemplary embodiments of the present inventive concept, an adhesive layer may be used to attach an interposer substrate to a first semiconductor chip. Accordingly, a semiconductor package having enhanced structural stability may be provided. Further, since the adhesive layer is embedded in the interposer substrate, the semiconductor package may have a compact size.

According to exemplary embodiments of the present inventive concept, the adhesive layer may include thermal conductive members disposed therein, whose thermal conductivity is high. Thus, the adhesive layer may increase in thermal conductivity. Therefore, heat generated from the first semiconductor chip may be efficiently discharged outwards through the interposer substrate, and the semiconductor package may have improved thermal stability.

In a method of fabricating the semiconductor package according to exemplary embodiments of the present inventive concept, a small distance may be provided between the second substrate pads and the third substrate pads, and a single connection terminal may connect each third substrate pad to its corresponding second substrate pad. Accordingly, the third substrate pads may be properly aligned with and efficiently connected to the second substrate pads, and a connection failure between the third substrate pads and the second substrate pads may be prevented.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor package, comprising:
   a first substrate comprising a first recess formed in a top surface of the first substrate;
   a first semiconductor chip disposed in the first recess and mounted on the first substrate;
   an interposer substrate disposed on the first semiconductor chip and comprising a second recess formed in a bottom surface of the interposer substrate;
   an adhesive layer disposed in the second recess and in contact with a top surface of the first semiconductor chip,
   wherein the adhesive layer is embedded in the interposer substrate, and a bottom surface of the adhesive layer does not extend below the bottom surface of the interposer substrate;
   a plurality of connection terminals spaced apart from the first recess and connecting the first substrate to the interposer substrate; and
   a molding layer disposed between the first substrate and the interposer substrate.

2. The semiconductor package of claim 1, wherein the first recess vertically overlaps the first semiconductor chip, wherein, when viewed in a plan view, the first semiconductor chip is disposed inside the first recess.

3. The semiconductor package of claim 2, wherein a size of a planar shape of the first recess is greater than a size of a planar shape of the first semiconductor chip.

4. The semiconductor package of claim 1, wherein a distance from a lateral surface of the first semiconductor chip to an inner lateral surface of the first recess is in a range of about 30 μm to about 600 μm.

5. The semiconductor package of claim 1, wherein a depth from the top surface of the first substrate to a floor surface of the first recess is in a range of about 5 μm to about 60 μm.

6. The semiconductor package of claim 1, wherein a distance from the top surface of the first substrate to the bottom surface of the interposer substrate is in a range of about 60 μm to about 200 μm.

7. The semiconductor package of claim 1, wherein, when viewed in a plan view, the first semiconductor chip is disposed inside the second recess.

8. The semiconductor package of claim 7, wherein a size of a planar shape of the second recess is greater than a size of a planar shape of the first semiconductor chip.

9. The semiconductor package of claim 7, wherein an inner lateral surface of the second recess is on a same plane as a lateral surface of the first semiconductor chip, or the inner lateral surface of the second recess is spaced apart from the lateral surface of the first semiconductor chip.

10. The semiconductor package of claim 1, wherein a depth from the bottom surface of the interposer substrate to a floor surface of the second recess is in a range of about 10 μm to about 50 μm.

11. The semiconductor package of claim 1, wherein the top surface of the first semiconductor chip is disposed at a same level or a higher than a level of the bottom surface of the interposer substrate.

12. The semiconductor package of claim 1, wherein the adhesive layer comprises:
an adhesive member; and
a plurality of thermal conductive members distributed in the adhesive member.

13. The semiconductor package of claim 1, wherein the molding layer fills a space between the first substrate and the interposer substrate and a space between the first semiconductor chip and a floor surface of the first recess.

14. A semiconductor package, comprising:
a first substrate;
a first semiconductor chip mounted on the first substrate;
a molding layer disposed on the first substrate, wherein the molding layer surrounds the first semiconductor chip and exposes a top surface of the first semiconductor chip;
an interposer substrate disposed on the first semiconductor chip; and
an adhesive layer disposed between the first semiconductor chip and the interposer substrate,
wherein the first substrate comprises a protruding portion disposed on a side of the first semiconductor chip and extending toward the interposer substrate,
wherein the interposer substrate is connected to the first substrate through a connection terminal disposed between the protruding portion and the interposer substrate,
wherein the adhesive layer is embedded in the interposer substrate, and a bottom surface of the adhesive layer does not extend below a bottom surface of the interposer substrate.

15. The semiconductor package of claim 14, wherein the protruding portion has a pillar shape extending along a lateral surface of the first semiconductor chip which faces the protruding portion.

16. The semiconductor package of claim 15, wherein, when viewed in a plan view, the protruding portion has an annular shape that surrounds the first semiconductor chip.

17. The semiconductor package of claim 14, wherein
the adhesive layer is disposed in a recess formed in the bottom surface of the interposer substrate, and
the adhesive layer is in contact with the top surface of the first semiconductor chip.

18. The semiconductor package of claim 17, wherein an inner lateral surface of the recess is on a same plane as a lateral surface of the first semiconductor chip, or the inner lateral surface of the recess is spaced apart from the lateral surface of the first semiconductor chip.

19. The semiconductor package of claim 14, wherein the top surface of the first semiconductor chip is at a same level or a higher than a level of the bottom surface of the interposer substrate.

20. The semiconductor package of claim 14, wherein the adhesive layer comprises:
an adhesive member; and
a plurality of thermal conductive members distributed in the adhesive member.

* * * * *